United States Patent [19]

Rossman et al.

[11] Patent Number: 4,926,287
[45] Date of Patent: May 15, 1990

[54] SPRING LOADED HAND OPERATED EXTRACTION/INSERTION LINE REPLACEABLE MODULE (LRM) LEVER

[75] Inventors: Herman Rossman, Randallstown, Md.; Sharon A. Duggan, Washington, D.C.

[73] Assignee: The United States of America as represented by the Secretary of the Air Force, Washington, D.C.

[21] Appl. No.: 327,939

[22] Filed: Mar. 23, 1989

[51] Int. Cl.⁵ ............................................... H05K 7/14
[52] U.S. Cl. .................... 361/392; 244/129.4; 361/415
[58] Field of Search ............... 361/386, 388, 415, 392; 244/129.4

[56] References Cited

U.S. PATENT DOCUMENTS

| | | | |
|---|---|---|---|
| 2,712,955 | 7/1955 | Andrews | 244/129.4 |
| 2,800,346 | 7/1957 | Manning | 244/129.4 |
| 3,243,660 | 3/1966 | Yuska et al. | 317/100 |
| 3,484,129 | 12/1969 | Askren | 294/15 |
| 3,942,586 | 3/1976 | Fries | 165/105 |
| 4,120,021 | 10/1978 | Roush | 361/388 |
| 4,414,605 | 11/1983 | Chino et al. | 361/388 |

*Primary Examiner*—Roy N. Envall, Jr.
*Attorney, Agent, or Firm*—William G. Auton; Donald J. Singer

[57] ABSTRACT

A spring-loaded, hand-operated line replaceable module lever is disclosed for use with a plug-in type electronic module in aircraft having a construction adapted for easy installation in or removal from a mating chassis by a person on the flight line even while wearing heavy or bulky gloves. The structure includes a lever/driver blade with an enlarged pivoting thumb grip, which is spring loaded toward the open position, for grasping between thumb and forefinger when the installation cover is removed.

1 Claim, 3 Drawing Sheets

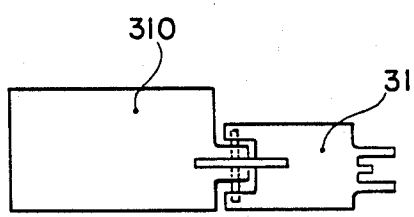
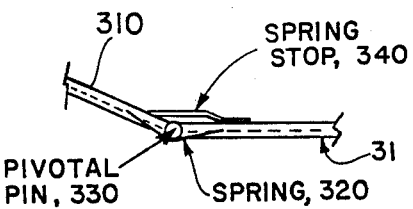
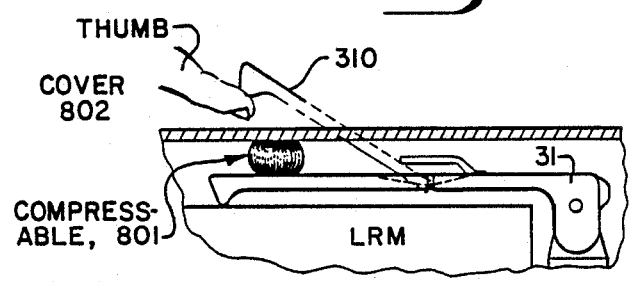
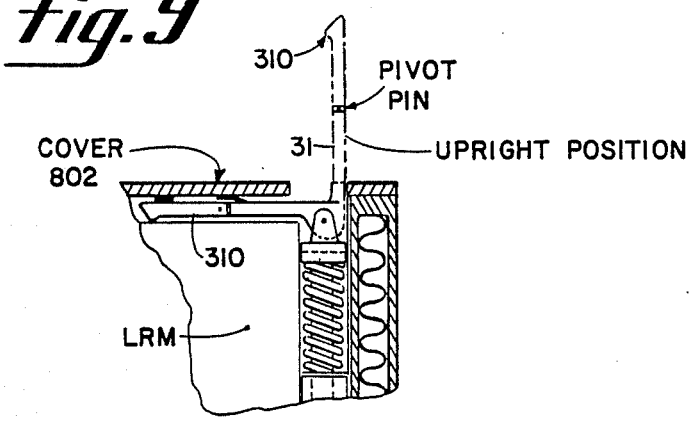

4,926,287

SPRING LOADED HAND OPERATED EXTRACTION/INSERTION LINE REPLACEABLE MODULE (LRM) LEVER

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to standard line replaceable modules, and more specifically to an improvement to positive locking mechanisms which allows their replacement, when protective gloves are used, with relative ease.

Future airborne electronic systems will be comprised primarily of a suite of standard line replaceable modules (LRM's) Line replaceable module systems are plug-in electronic modules which are slidably mounted in grooves in a chassis. One such plug-in module is shown in U.S. Pat. No. 3,243,660, entitled "Electronic Module Assembly", which was issued Mar. 29, 1966, to Leonard J. Yuska and David P. Zimmerman. While such modules represent an advance in electronic equipment, they remain difficult to remove and replace in maintenance conditions which require the use of protective gloves.

The task of improving existing line replaceable modules so that their installation and replacement is easier is alleviated, to some extent, by the use of the U.S. Pat. No. 4,414,605 entitled "Positive Locking Mechanism" issued to Chino et al, the disclosure of which is specifically incorporated by reference. The Chino et al reference discloses a positive locking mechanism for securing a plug-in electronic module in a chassis. A threaded element forces a module connector into engagement with a mating connector in the chassis. A pivotal driver blade is provided for turning the threaded element and, after the connectors are mated, the driver blade is pivoted and a cam thereon actuates wedges which provide a good thermal interface between the electronic module and the chassis. The driver blade also serves as means for extracting the plug-in electronic module from the chassis.

While the Chino et al system represents a definite advance in module electronics, a need remains to improve the lock mechanisms of line replaceable modules so that their installation and replacement may be accomplished by personnel wearing protective gloves. The present invention is directed towards satisfying that need.

SUMMARY OF THE INVENTION

The present invention provides a means of enabling maintenance personnel who are wearing gloves to install and replace line replaceable modules. One embodiment of the invention includes a spring loaded, pivotal thumb grip which will enable the user to lift the lever/driver blade of the positive locking mechanism of an LRM into the maintenance position in order to permit the extraction and insertion of LRM's with relative ease. This pivotal thumb grip is designed to be a direct improvement to the positive locking mechanism of the above-cited Chino et al reference, and is characterized as having: (1) increased thumb grip area to the lever/driver blade for ease of maintenance; (2) a spring action which lifts the lever into a "ready to extract position" which will allow ease of grasping even when protective gloves are used (3) "Stow positioning" by the use of constant pressure exerted by the electronics housing cover.

The features described above are accomplished using a pivotal thumb grip which is pivotally connected with the lever/driver blade of the positive locking mechanism of the Chino et al reference; a hinge pin which pivotally connects the pivotal thumb grip to the lever/driver blade; a biasing spring which is connected to the hinge pin between the thumb grip and lever/driver blade and which lifts the thumb grip into the extract position; and a compressed stop which is positioned between the electronics cover and the thumb grip to hold the thumb grip in the stop position when the LRM is installed.

As described above, it is an object of the present invention to facilitate the extraction and insertion of LRM's within a short duration of time and without the use of tools.

It is another object of the present invention to allow the replacement of line replaceable modules without tools when protective gloves must be worn.

These objects together with other objects, features and advantages of the invention will become more readily apparent from the following detailed description when taken in conjunction with the accompanying drawings wherein like elements are given like reference numerals throughout.

DESCRIPTION OF THE DRAWINGS

FIG. 6 is a plan view of the present invention;

FIG. 7 is a sectional side view of the system of FIG. 6;

FIG. 8 is a side view of the present invention applied to a line replaceable module; and FIG. 9 is another view of the system of FIG. 8.

DETAILED DESCRIPTION OF THE PREFERRED EMBODIMENT

The present invention includes a spring-loaded, hand-operated pivotal thumb grip which allows line replaceable modules to be installed and replaced without tools by personnel wearing protective gloves. This invention is directly applicable to the positive locking mechanism of the above-cited Chino et al reference.

Figure 1:
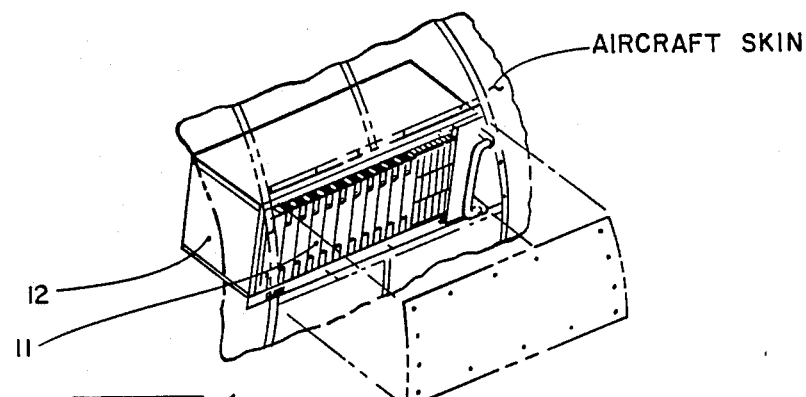
FIG. 1 is a view of multiple prior art line replaceable modules installed in a chassis.

The reader's attention is now directed towards FIG. 1, which is a view of multiple line replaceable modules 11 installed in a chassis 12 beneath the skin of an aircraft. As mentioned above, these line replaceable modules are plug-in electronic modules that are slidably mounted in grooves in a chassis.

FIGS. 2-5 are views of the positive locking mechanism of the Chino et al reference. This system of Chino et al is an improvement in the art in that it allows LRM's to be installed without tools. Since the present invention is designed to work with the positive locking mechanism of the Chino et al reference, it is appropriate that the basic positive locking mechanism of the Chino et al reference be understood, as described below.

Figure 2:
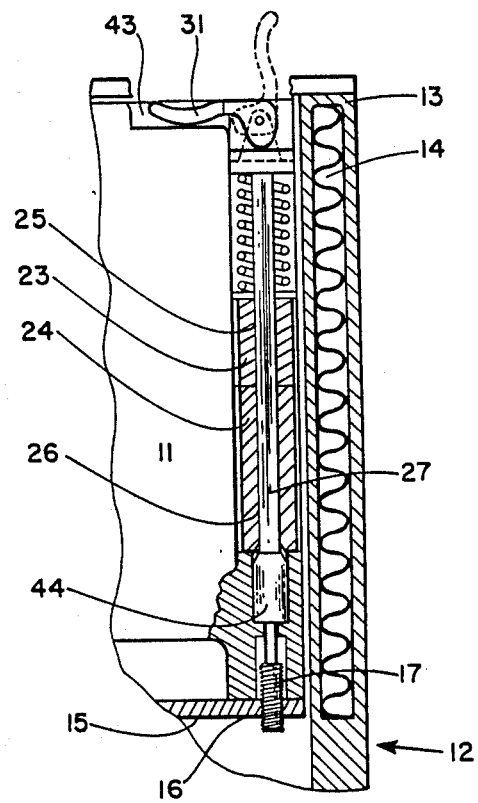
FIGS. 2-5 are views of the prior art positive locking mechanism of the Chino et al reference.
Figure 3:
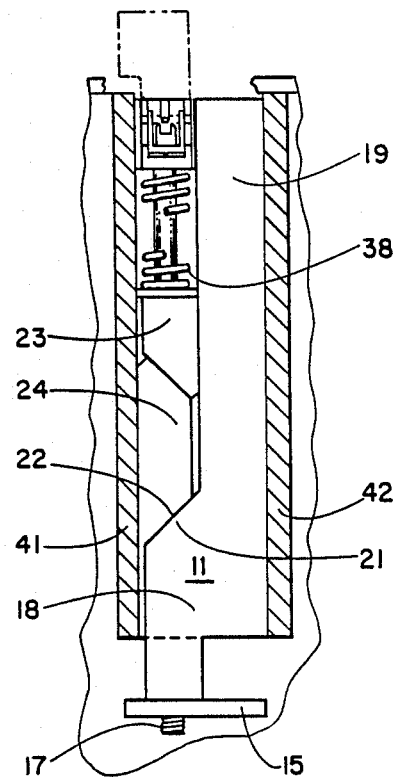

FIG. 2 is a partial end view of the positive locking mechanism of the Chino et al reference in which an electronic plug-in module 11 is mounted in a chassis 12. The wall 13 of the chassis is shown having a passage arrangement 14 through which either cooling water or air can pass in order to remove heat from chassis 12 which is transferred from a plurality of modules 11.

A female connector is provided for each module 11 and these female connectors are attached to a base plate 15. Base plate 15 has a pair of threaded holes 16 provided for each module 11 and a threaded element 17 is provided at each end of module 11 so that module 11 can be secured to base plate 15. As shown in FIG. 2 of the drawing, module 11 has a wide portion 18 at its bottom end and a more narrow portion 19 at its upper end. A tapered portion 21 joins the wide and narrow portions and thus provides a wedge surface 22. A pair of wedges 23 and 24 are provided above wedge surface 22 and wedges 23 and 24 have clearance holes 25 and 26, respectively, therein so that an unthreaded portion 27 of threaded element 17 is positioned within wedges 23 and 24. Threaded element 17 is provided with a head 28 which is provided with a screwdriver slot 29.

Figure 4:
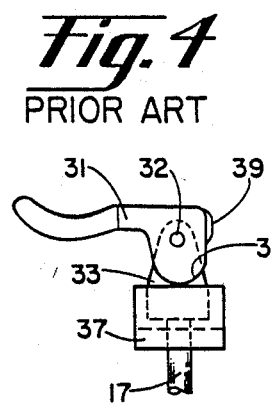
Figure 5:
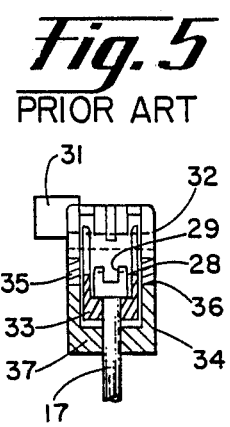

Referring now to FIGS. 4 and 5 of the drawings, a lever 31 is pivotally supported on shaft 32 which is attached to a U-shaped bracket 33. Bracket 33 has a hole 34 through which threaded element 17 is passed so that bracket 33 is supported about threaded element 17. Lever 31 is provided with a pair of cam surfaces 35 and 3 which are engageable with a U-shaped spring compressor 37 and the top of wedge 23. Lever 31 is also provided with a driver blade 39 which is engageable with slot 29 in threaded element 17.

In operation, a plug-in module 11 is guided between rails 41 and 42 and the male connector on module 11 is partially engaged with a female connector on base plate 15. Lever 31 is then rotated and pivoted so that driver blade 39 engages slot 29 in head 28 of threaded element 17. Turning of lever 31 causes threaded element 17 to be threaded with hole 15 and as there is a threaded element 17 at each end of module 11, the male connector on module 11 will be slowly engaged with the female connector on base plate 15. The amount of travel of threaded element 17 is limited by the enlarged diameter portion 44. When threaded element 17 has been fully engaged in hole 16, lever 31 is pivoted about shaft 32 and lever 31 is positioned in clearance slot 43. Rotation of lever 31 about shaft 32 causes cam surfaces 35 and 36 to depress spring compressor 37 and thereby compress spring 38. Spring 38 thus applies a biasing force against wedge 23 which, in turn moves wedge 24 into contact with rail 41 and facilitates heat transfer from module 11 to chassis 12. The position of lever 31 serves as an indicator that wedge 24 is in contact with rail 41 thereby facilitating heat transfer from module 11 to chassis 12. When lever 31 is pivoted downwardly into clearance slot 43, wedge 24 is biased against rail 41, and when lever 31 is in an upright position, no biasing force is applied by spring 38 against wedges 23 and 24. Thus it can be seen that the position of lever 31 readily indicates the position of wedges 23 and 24.

When it is desired to remove module 11 from chassis 12, a reverse order of the above-described steps is performed. Lever 31 is first pivoted to an upright position and rotation of cam surfaces 35 and 36 permits spring 38 to expand thus removing the biasing force from wedges 23 and 24. Driver blade 39 is again engaged in slot 29 of head 28 and lever 31 is turned in order to disengage threaded element 17 from hole 16. When element 17 is disengaged, lever 31 is used as a handle or grip to remove module 11 from chassis 12.

It can thus be seen that the invention of Chino et al provides an improved locking mechanism for attaching a plug-in electronic module to a chassis and for assuring good heat transfer from the module to the chassis.

Currently, there exists circumstances in which maintenance must be achievable even when protective gloves are used. These circumstances can include the requirements to perform such maintenance even in the presence of toxic chemical agents. The potential sources of these chemical agents that pose this threat range from potential accidents to intentional chemical attacks by hostile forces.

FIG. 6 is a plan view which depicts some features of the present invention. FIG. 6 shows the pivotal thumb grip 310 which is pivotally connected with the lever/driver blade 31 used in the positive locking mechanism of the above-cited Chino et al reference. However, as illustrated in FIG. 6, the lever/driver blade as either been modified or replaced so that it has lugs through which a hinge pin 330 projects to connect it with the pivotal thumb grip 310.

FIG. 7 is a sectional side view of the mechanism of FIG. 6. FIG. 7 shows the hinge pin 330 which extends through lugs in both the pivotal thumb grip 310 and the lever/driver blade 31 to pivotally connect them together. Also illustrated in FIG. 7 is the biasing spring 320 which is looped around the hinge pin 330, and which has two tips embedded into notches in the pivotal thumb grip 310 and lever driver blade 31. The biasing spring applies a constant impulse in the pivotal thumb grip, which tends to push it so that it rotates upwards into the "ready-to-extract" position. When the pivotal thumb grip springs open, it has a large thumb grip area in comparison with the lever/driver blade 31 of FIG. 4.

As mentioned above, the lever/driver blade 31 of FIG. 6 is similar to that in FIG. 4, except it has either been modified or replaced so that it has lugs through which it may be connected with the pivotal thumb grip 310. In all other respects, the lever/driver blade 31 of FIG. 6 interconnects with the positive locking mechanism of the Chino et al reference.

The spring stop 340 shown in FIG. 7 is a metal strip which is attached to the lever/driver blade 31 and which extends over the pivotal thumb grip 310 with sufficient clearance to allow the thumb grip 310 to spring up into a graspable position, when impelled by the spring 320. This spring stop provides a fulcrum for the pivotal thumb grip 310 so that it may be used to lift the lever/driver blade 31 into the upright position shown in FIG. 9, and discussed below.

FIG. 8 is a side view of the present invention as applied to a line replaceable module which is installed in a chassis. As shown in FIG. 8, a compressible stop 801 is fixed to the electronic installation cover 802 the chassis. Once this cover is removed, the pivotal thumb grip automatically springs up into a graspable position. FIG. 9 is a side view of the system of FIG. 8 with the pivotal thumb grip 310 and the lever/driver blade in the vertical position. Once the pivotal thumb grip 310 is lifted into a vertical position by thumb pressure, the positive locking mechanism permits extraction of the LRM by simply pulling it out of the chassis.

As described above, the present invention presents an improvement to the positive locking mechanism of the Chino et al reference. This improvement includes enabling maintenance personnel to easily remove LRM's without tools under conditions in which they must wear gloves.

While this invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In an electronic plug-in module which is mounted in a chassis which has a cover, and which has a positive locking mechanism with a lever/driver blade which permits the electronic plug-in module to be installed and removed from the chassis without tools, when said lever/driver blade is lifted into a vertical position by disengaging from said chassis, wherein the improvement comprises:
   a pivotal thumb grip which is pivotally attached to said lever/driver blade and which permits personnel wearing gloves to lift said lever/driver blade into said vertical position by automatically springing into a graspable position when said cover is removed from said chassis, wherein said pivotal thumb grip and said lever/driver blade each have a set of interconnecting lugs which may be axially aligned so that they have a common axis through which a pin may be inserted to pivotally interconnect them;
   a means for springing said pivotal thumb grip into said graspable position when said cover is removed from said chassis, wherein said springing means comprises a spring which is coiled around said hinge pin, said spring having ends that abut said lever/driver blade and said pivotal thumb grip so that it provides a constant impulse that tends to push said pivotal thumb grip into said graspable position; and
   a compressible stop which is fixed to said cover and which depresses said pivotal thumb grip so that said positive locking mechanism locks said electronic plug-in module into said chassis when said cover is installed on said chassis.

* * * * *